(12) United States Patent
Wu (10) Patent No.: US 12,033,920 B2
(45) Date of Patent: Jul. 9, 2024

(54) SEMICONDUCTOR STRUCTURE AND FORMATION METHOD THEREOF

(71) Applicant: CHANGXIN MEMORY TECHNOLOGIES, INC., Hefei (CN)

(72) Inventor: Pingheng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 364 days.

(21) Appl. No.: 17/511,844

(22) Filed: Oct. 27, 2021

(65) Prior Publication Data

US 2022/0051968 A1 Feb. 17, 2022

Related U.S. Application Data

(63) Continuation of application No. PCT/CN2021/086458, filed on Apr. 12, 2021.

(30) Foreign Application Priority Data

Apr. 16, 2020 (CN) .......................... 202010299821.5

(51) Int. Cl.
*H01L 23/48* (2006.01)
*H01L 21/768* (2006.01)
*H01L 25/065* (2023.01)

(52) U.S. Cl.
CPC ...... *H01L 23/481* (2013.01); *H01L 21/76877* (2013.01); *H01L 21/76898* (2013.01); *H01L 25/0657* (2013.01)

(58) Field of Classification Search
CPC ............. H01L 23/481; H01L 21/76877; H01L 21/76898; H01L 25/0657; H01L 2225/06541; H01L 23/48; H01L 21/76804; H01L 21/76816; H01L 21/76831; H01L 23/528; H01L 2221/101; H01L 2221/1057; H01L 2221/1068
See application file for complete search history.

(56) References Cited

U.S. PATENT DOCUMENTS 6,492,263 B1 12/2002 Peng et al.
10,243,020 B1 3/2019 Clevenger
(Continued)

FOREIGN PATENT DOCUMENTS

CN 101266991 A 9/2008
CN 103187522 A 7/2013
(Continued)

OTHER PUBLICATIONS

ISR for International Application PCTCN2021086458 mailed Jul. 14, 2921.
(Continued)

*Primary Examiner* — Robert G Bachner
(74) *Attorney, Agent, or Firm* — Kilpatrick Townsend & Stockton LLP (57) ABSTRACT

The present application relates to the field of semiconductor technologies, and discloses a semiconductor structure and a formation method thereof. The method includes: providing a semiconductor substrate, the semiconductor substrate including a TSV; forming a dielectric layer on a surface of the semiconductor substrate, the dielectric layer being provided with an embedded metal landing pad; and etching the dielectric layer to form a communication hole for communicating the TSV with the metal landing pad.

8 Claims, 8 Drawing Sheets

(56) References Cited

U.S. PATENT DOCUMENTS

2011/0291225 A1    12/2011  Klatt
2016/0133570 A1     5/2016  Matsuo
2018/0061710 A1     3/2018  Oshige

FOREIGN PATENT DOCUMENTS

| CN | 104377180 A | 2/2015 |
| CN | 104882429 A | 9/2015 |
| CN | 105975114 A | 9/2016 |
| CN | 108336020 A | 7/2018 |
| CN | 104377180 B | 9/2018 |
| CN | 105975114 B | 4/2019 |
| CN | 109585402 A | 4/2019 |
| CN | 109742064 A | 5/2019 |
| CN | 110310918 A | 10/2019 |
| CN | 210200731 U | 3/2020 |
| JP | 2005093486 A | 4/2005 |
| TW | I245379 B | 12/2005 |
| TW | 201533875 A | 9/2015 |

OTHER PUBLICATIONS

First Office Action and Search Report of Chinese Patent Application No. 202010299821.5, mailed Jul. 6, 2022.
Second Office Action of the Chinese application No. 202010299821.5, issued on Dec. 1, 2022.
English translation of Written Opinion of the International Search Authority in the international application No. PCT/CN2021/086458, mailed on Jul. 14, 2021.

SEMICONDUCTOR STRUCTURE AND FORMATION METHOD THEREOF

CROSS-REFERENCE TO RELATED APPLICATIONS

This application is a continuation of International Application No. PCT/CN2021/086458 filed on Apr. 12, 2021, which claims priority to Chinese Patent Application No. 202010299821.5 filed on Apr. 16, 2020. The entire contents of the aforementioned patent applications are incorporated herein by reference.

TECHNICAL FIELD

The present application relates to the field of semiconductor technologies, in particular to a semiconductor structure and a formation method thereof.

BACKGROUND

A dynamic random access memory is a semiconductor memory widely used in a multi-computer system. With continuous reduction of a feature size of a semiconductor integrated circuit device, the dynamic random access memory is also continuously developed to a higher integration level, thereby posing more serious challenges to a semiconductor manufacturing technology. Especially, a semiconductor-structure packaging technology is one of main methods for improving an integration level of a chip.

In the field of semiconductor technologies, after a through silicon via (TSV, also called a TSV structure) is etched, a TSV insulating layer is required to be formed on a side wall to prevent TSV metal from leaking electricity to a substrate. However, when the TSV lands on a metal landing pad, metal diffusion occurs when the TSV insulating layer is embedded before a tantalum or tantalum nitride layer is formed on the TSV. Meanwhile, a method of depositing, double etching and then embedding the TSV insulating layer does not consider a possible side etching phenomenon by the double etching operation on a material switching part, or a deeper TSV bottom hole formed by the double etching operation, which does not facilitate generation of a metal barrier layer and also becomes weakness of future chip delamination. Moreover, if an axis of the double etching operation vertically extends to a bottom, a larger landing pad is necessary to be provided correspondingly, wasting a design space.

If a stacked structure is applied to a final TSV structure after silicon wafers are stacked, the TSV etching operation with weak side wall protection may generate a significant side etching phenomenon on a weak junction surface of bonded locations between the silicon wafers, which not only does not facilitate generation of the metal barrier layer, but also becomes weakness of future chip delamination.

Therefore, how to improve a technology, so as to reduce an alignment requirement of connection with the landing pad to avoid an alignment abnormality, reduce a size of the landing pad to increase a designable area, and meanwhile effectively avoid diffusion of the metal barrier layer to improve a blocking effect thereof is a technical problem urgent to be solved currently.

SUMMARY

The present application aims at providing a semiconductor structure and a formation method thereof.

The present application provides a formation method of a semiconductor structure, the formation method including the following steps:

providing a semiconductor substrate, the semiconductor substrate including a TSV;

forming a dielectric layer on a surface of the semiconductor substrate, the dielectric layer being provided with an embedded metal landing pad; and etching the dielectric layer to form a communication hole for communicating the TSV with the metal landing pad.

The present application further provides a semiconductor structure, including:

a semiconductor substrate including a TSV;

a dielectric layer deposited on a surface of the semiconductor substrate, the dielectric layer being provided with an embedded metal landing pad; and a communication hole provided in the dielectric layer, the metal landing pad being communicated with the TSV through the communication hole.

The present application further provides a semiconductor structure, including:

a plurality of semiconductor substrates including TSVs;

dielectric layers deposited on surfaces of the semiconductor substrates, the dielectric layers being provided with embedded metal landing pads and configured to be stacked with the semiconductor substrates layer by layer; and a communication hole provided in the dielectric layer, the metal landing pad being communicated with the TSV through the communication hole.

BRIEF DESCRIPTION OF DRAWINGS

To describe the technical solutions in the embodiments of the present application more clearly, the following briefly describes the accompanying drawings required in the embodiments of the present application. Apparently, the accompanying drawings in the following description show merely some embodiments of the present application, and a person of ordinary skill in the art may still derive other drawings from these accompanying drawings without creative efforts.

REFERENCE NUMERALS

100: semiconductor substrate;
200: metal landing pad;
210: landing-pad passivation layer;
130: TSV;
111: communication hole;
110: dielectric layer;
101: insulating layer;
102: passivation layer;
120: barrier layer;
300: filling metal.

DESCRIPTION OF EMBODIMENTS

To make the objectives, technological means and effects thereof of the present application clearer, the following further describes the present application with reference to the accompanying drawings. It should be understood that the embodiments described herein are merely some but not all of the embodiments of the present application, and are not intended to limit the present application. All other embodiments obtained by those skilled in the art based on the embodiments of the present application without creative efforts shall fall within the protection scope of the present application.

Figure 1:
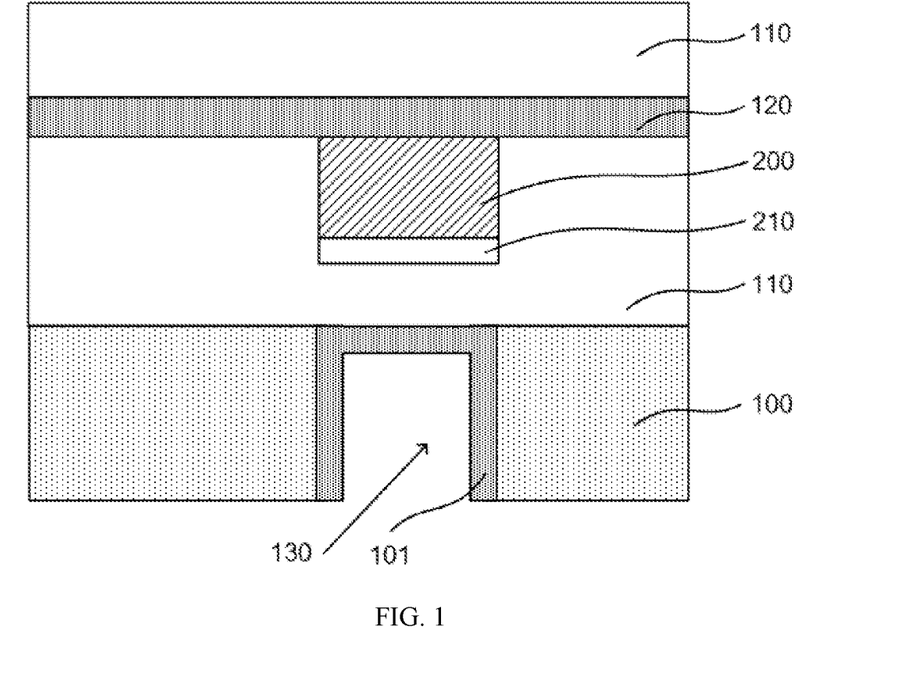
FIGS. 1 to 5 are schematic structural diagrams obtained by sequentially implementing steps in a formation method of a semiconductor structure according to an embodiment of the present application.

Step 1: providing a semiconductor substrate 100, the semiconductor substrate 100 including a TSV 130, referring to FIG. 1. The TSV 130 is specifically formed by: etching the semiconductor substrate 100 to form an open pore; and depositing an insulating layer 101 on a surface of the open pore.

The semiconductor substrate 100 may include, but is not limited to, a monocrystalline silicon substrate, a polycrystalline silicon substrate, a gallium nitride substrate, or a sapphire substrate, and when configured as a monocrystalline substrate or a polycrystalline substrate, the semiconductor substrate 100 may also be configured as an intrinsic silicon substrate or a doped silicon substrate, and further, an N-type polycrystalline silicon substrate or a P-type polycrystalline silicon substrate.

Specifically, in the present embodiment, dry etching is performed in a direction perpendicular to a surface of the semiconductor substrate 100 to form the open pore (i.e., the TSV 130) of the substrate.

Two basic etching processes exist in semiconductor manufacture: dry etching and wet etching. The dry etching is a technological method in which gaseous plasma physically and chemically reacts with a silicon wafer exposed to the plasma through a window in a masking layer formed by photolithography, so as to etch away an exposed surface material on the silicon wafer. Compared with the wet etching, the dry etching shows both chemical isotropy (meaning etching operations in both vertical and horizontal directions) and physical anisotropy (meaning an etching operation in a single vertical direction) in etching characteristics. The dry etching is a technology of performing a thin film etching operation using plasma. Gas in a plasma form has two characteristics: on the one hand, the gas in the plasma has much stronger chemical activities than in a normal state, and proper gas may be selected according to an etched material to react with the material more quickly, so as to etch away the material; on the other hand, the plasma may be guided and accelerated using an electric field to have certain energy, and when the plasma bombards a surface of an etched object, atoms of the material of the etched object may be bombarded out, thereby realizing etching by physical energy transfer. Thus, the dry etching is a result of a balance of both physical and chemical processes on a surface of the wafer. Therefore, in the present embodiment, an ideal effect may be achieved using the dry etching, and a shape of the rectangular open pore is precisely etched on the surface of the semiconductor substrate 100.

Further, an insulating layer 101 is deposited on a side wall of the TSV 130. The insulating layer 101 is configured to isolate a metal material inside the TSV 130 from the semiconductor substrate subsequently.

Further, a dielectric layer 110 is formed on the surface of the semiconductor substrate 100, the dielectric layer 110 being provided with an embedded metal landing pad 200 and a landing-pad passivation layer 210. Specifically, the landing-pad passivation layer 210 is located on an end surface of the embedded metal landing pad 200 close to a communication hole 111; an end surface of the embedded metal landing pad 200 apart from the communication hole 111 is connected with a barrier layer 120 in the dielectric layer 110.

Specifically, the dielectric layer 110 is deposited on the surface of the semiconductor substrate 100 using a deposition process. A thin film deposition process includes two main deposition methods: chemical vapor deposition which is a growth technology in which after activated in a certain way, gas of one or more substances chemically reacts on a surface of a substrate to deposit a required solid film; and physical vapor deposition which is a technology of transferring substances using a certain physical process, that is, transferring atoms or molecules to a surface of a silicon substrate to deposit a thin film. Technologies for depositing the thin film further include a spin-coating method, an electroplating method, or the like. For example, in the present embodiment, the dielectric layer 110 may be deposited in various ways. For example, a dielectric layer 110 with a predetermined thickness distribution is deposited on the surface of the semiconductor substrate 100 using chemical vapor deposition. Further, by independently utilizing control means of controlling a flow velocity of an introduced gas flow, controlling a flow quantity of the introduced gas flow, controlling a deposition duration or controlling a deposition temperature, and by improving precision of control over the gas flow and the temperature, all atoms may be guaranteed to be orderly arranged during deposition to form a single crystal layer, and finally, the dielectric layer 110 with a uniform thickness may be obtained on the surface of the semiconductor substrate 100.

Common deposition materials include monocrystalline silicon, polycrystalline silicon, silicon dioxide, silicon nitride, insulating materials for isolating interconnect layers, or the like. Therefore, the material of the dielectric layer may include, but is not limited to, silicon dioxide, silicon nitride, silicon oxynitride, polycrystalline silicon, monocrystalline silicon, carbon, or the like. For example, in the present embodiment, the dielectric layer 110 may be made of silicon carbide or silicon nitride.

In the present embodiment, an open pore end of the TSV 130 and the metal landing pad 200 are spaced apart by the dielectric layer 110 and the barrier layer 120, and not communicated with each other before a TSV packaging technology starts. Meanwhile, the present embodiment is suitable for not only a single wafer with the TSV 130 formed from B/S, but also stacked wafers. Further, in another embodiment, the TSV 130 may not be perfectly aligned with the metal landing pad 200. Even if a top end of the TSV 130 does not completely correspond to a bottom end of the metal landing pad due to an error of a double etching process, a conduction function may be achieved as long as parts thereof are connected.

Therefore, the present embodiment may prevent the metal from leaking electricity to the substrate in the process, and avoid possibly generating a side etching phenomenon at a material switching part in the subsequent double etching process.

Figure 2:
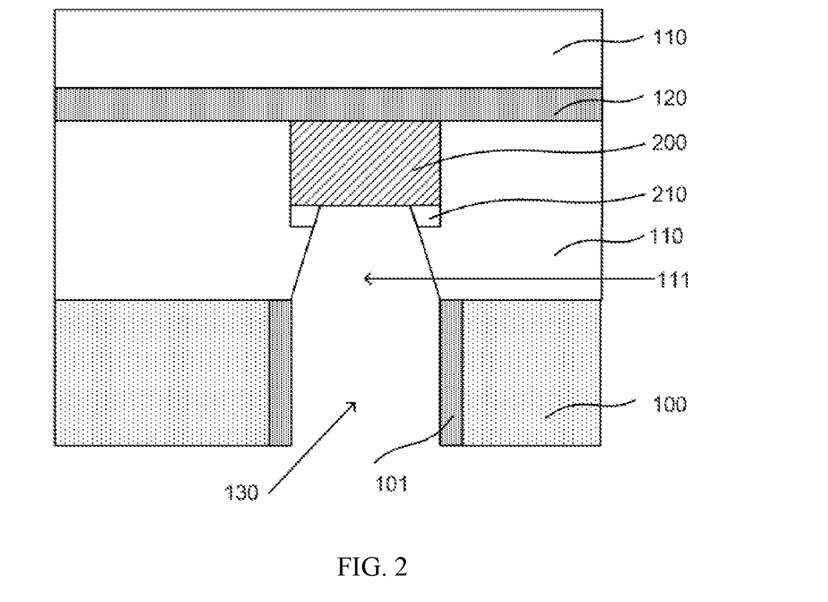
Figure 3:
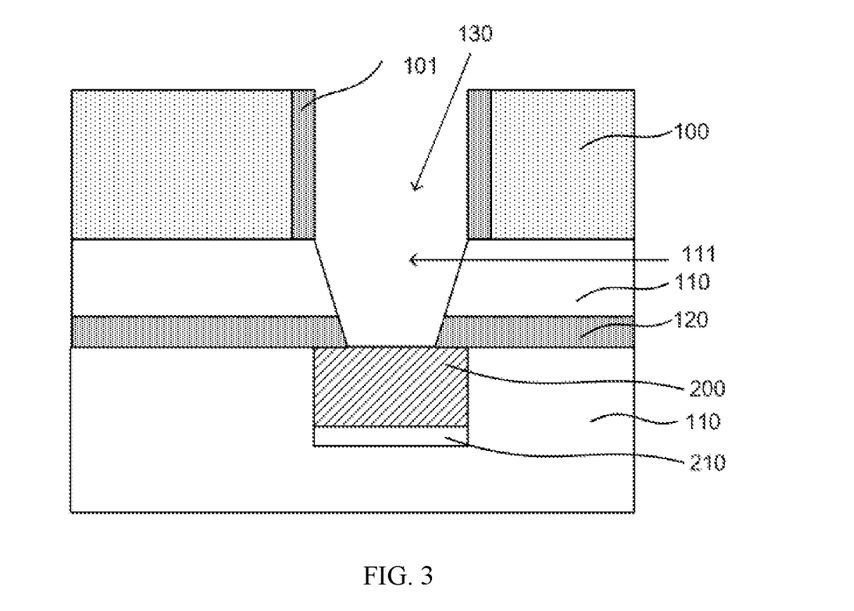

Step 2: double etching the dielectric layer 110 along the TSV 130 to form the communication hole 111 exposing the metal landing pad 200, referring to FIGS. 2 and 3. FIGS. 2 and 3 are schematic diagrams of different positional relationships between the dielectric layer 110 and the semiconductor substrate 100, with FIG. 2 being a schematic diagram in which the dielectric layer 110 is located on an upper surface of the semiconductor substrate 100, and FIG. 3 being a schematic diagram in which the dielectric layer 110 is located on a lower surface of the semiconductor substrate 100. Referring to FIG. 2, if the dielectric layer 110 is located on the upper surface of the semiconductor substrate 100, in the step 2, the dielectric layer 110 and the barrier layer 120 are continuously etched from the lower surface of the semiconductor substrate 100 along the TSV 130 to form the communication hole 111 exposing the metal landing pad 200. Referring to FIG. 3, if the dielectric layer 110 is located on the lower surface of the semiconductor substrate 100, the dielectric layer 110 and the barrier layer 120 are continuously etched from the upper surface of the semiconductor substrate 100 along the TSV 130 to form the communication hole 111 exposing the metal landing pad 200.

Specifically, in the present embodiment, if the dielectric layer 110 is located on the upper surface of the semiconductor substrate 100, the dielectric layer 110 and the barrier layer 120 are continuously etched from the lower surface of the semiconductor substrate 100 along the TSV 130 to form the communication hole 111 exposing the metal landing pad 200. As shown in FIG. 2, the open pore of the TSV 130 has a rectangular cross section, and the communication hole 111 has a trapezoidal cross section. Further, the dielectric layer 110 and the landing-pad passivation layer 210 are continuously etched along the open pore of the TSV 130 using the corresponding etching process, so as to form the communication hole 111 exposing the metal landing pad 200.

In the present embodiment, a thin film etching technology using plasma is used to etch downwards in a direction perpendicular to the semiconductor substrate 100, and by adjusting etching parameters, the communication hole 111 may be etched, and a contact area between the communication hole 111 and the metal landing pad 200 is less than a contact area between the communication hole 111 and the TSV 130; specifically, for example, the communication hole 111 with a trapezoidal cross section is etched as shown in the drawing.

Specifically, a contact surface between the communication hole 111 and the metal landing pad 200 is defined as a first contact surface, an included angle α is formed between the first contact surface and a side wall of the communication hole 111, and $45° \leq \alpha < 90°$. A size of a bottom end of an opening is reduced by reducing a vertical angle. Meanwhile, in a subsequent process, a non-vertical slope, such as a trapezoid hypotenuse, may also increase an adhesive force of the side wall to prevent delamination.

Further, a contact surface between the communication hole 111 and the TSV 130 is defined as a second contact surface, and the first contact surface has an area less than the second contact surface. Since the contact area between the communication hole 111 and the metal landing pad 200 is less than the contact area between the communication hole 111 and the TSV 130, a size of the metal landing pad 200 may be designed to be less than a size of the open pore of the TSV 130. The size of the metal landing pad 200 is less than the size of the open pore of the TSV 130 by 0.2 to 2 microns. Meanwhile, the metal landing pad 200 may be aligned or not perfectly aligned with the open pore predicted to be connected.

Therefore, compared with the TSV packaging technology in some semiconductor technologies, in the present application, an improvement is mainly performed on designs of the TSV and the metal landing pad, and the communication hole is introduced into the new structural design, thus avoiding necessary contact between the metal landing pad and the TSV; meanwhile, communication may be realized only by contacting one end of the communication hole with the metal landing pad, connecting the other end thereof with the TSV, and then filling the metal, and such a design reduces an alignment requirement of connection with the landing pad to avoid an alignment abnormality, and may effectively reduce a size of the landing pad to increase a designable area. In addition, diffusion of the metal barrier layer is effectively avoided to improve a blocking effect thereof.

Figure 4:
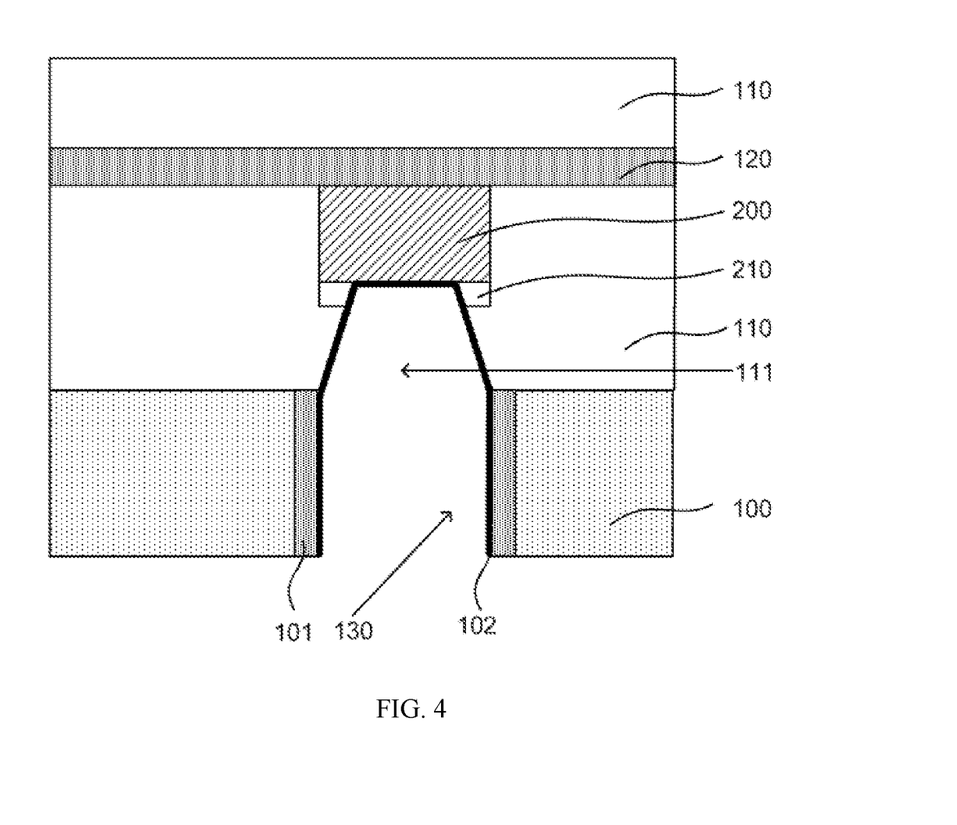

Step 3: forming passivation layers 102 on inner walls of the TSV 130 and the communication hole 111, referring to FIG. 4.

Specifically, the passivation layers 102 are deposited on surfaces of the inner walls of the TSV 130 and the communication hole 111. In the present embodiment, an electroplating method may be used for the deposition. The passivation layer 102 is made of tantalum, tantalum nitride, and copper seeds.

The passivation layer 102 is configured to prevent the filled conductive material from migrating towards the substrate and also to improve adhesion between the conductive material and the insulating layer to enhance an adhesive force. For example, the passivation layer 102 is made of copper seeds. In order to better facilitate the subsequent process of filling a metal layer, preparation may be made in advance to form a copper seed layer in this step.

The TSV etching operation with weak side wall protection may generate a significant side etching phenomenon on a weak junction surface of bonded locations between the silicon wafers, which not only does not facilitate generation of the metal barrier layer, but also becomes weakness of future chip delamination. Therefore, the passivation layers are required to be formed on the surfaces of the TSV and the communication hole, and the diffusion of the metal barrier layer is effectively avoided to improve the blocking effect thereof.

Therefore, compared to the TSV packaging technology in some semiconductor technologies, an additional gradient contact window structure is designed at a bottom layer of the TSV in the present embodiment, and a method of enhancing sidewall protection is selected to fabricate an axis with an obvious oblique angle (non-vertical), so as to facilitate uniformity of a tantalum or tantalum nitride layer formed at the bottom, thereby improving the metal blocking effect, and protecting the material transition interface of the side wall or the weak junction surface of the bonded locations between the silicon wafers to reduce the side etching phenomenon. A technology with enhanced side wall protection is selected to improve the effect of the metal barrier layer, and the junction surface is selected to reduce the side etching phenomenon, so as to protect the material transition interface of the side wall or the weakness of the bonded locations between the silicon wafers, thereby effectively avoiding the diffusion of the metal barrier layer to improve the blocking effect thereof, reducing the alignment requirement of connection with the landing pad to avoid the alignment abnormality, and reducing the size of the landing pad to increase the designable area.

Figure 5:
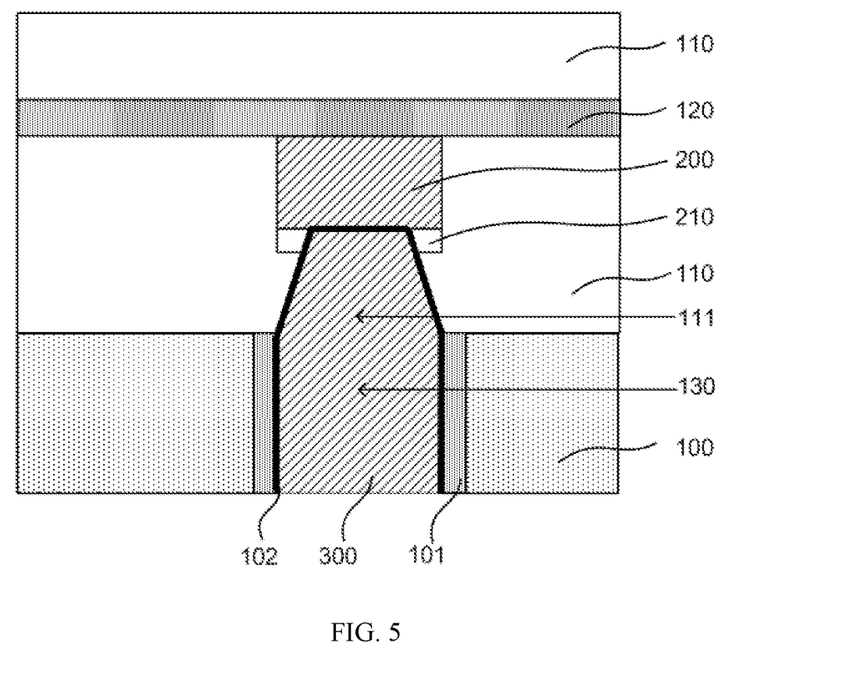

Step 4: filling the TSV 130 and the communication hole 111 with metal 300 to cover the passivation layer 102 and the metal landing pad 200, referring to FIG. 5. Copper may serve as the filling metal 300.

Therefore, in the present application, the improvement is mainly performed on the designs of the TSV and the metal landing pad, and the new structural design may avoid necessary contact between the metal landing pad and the TSV, and meanwhile reduce the alignment requirement of connection with the landing pad to avoid the alignment abnormality, and reduce the size of the landing pad to increase the designable area. In addition, the technology with enhanced side wall protection is selected to improve the effect of the metal barrier layer, and the junction surface is selected to reduce the side etching phenomenon, so as to protect the material transition interface of the side wall or the weakness of the bonded locations between the silicon wafers, thereby effectively avoiding the diffusion of the metal barrier layer to improve the blocking effect thereof.

The present application further provides a semiconductor structure.

Referring to FIG. 2, the semiconductor structure includes a semiconductor substrate 100, a metal landing pad 200, a landing-pad passivation layer 210, an insulating layer 101 and a dielectric layer 110.

The semiconductor substrate 100 is provided with a TSV 130. The semiconductor substrate 100 may include, but is not limited to, a monocrystalline silicon substrate, a polycrystalline silicon substrate, a gallium nitride substrate, or a sapphire substrate, and when configured as a monocrystalline substrate or a polycrystalline substrate, the semiconductor substrate 100 may also be configured as an intrinsic silicon substrate or a doped silicon substrate, and further, an N-type polycrystalline silicon substrate or a P-type polycrystalline silicon substrate. In the present embodiment, dry etching is performed in a direction perpendicular to a surface of the semiconductor substrate 100 to form an open pore of the substrate. The insulating layer 101 is configured to isolate a metal material inside a communication hole 111 from the semiconductor substrate 100.

The dielectric layer 110 is deposited on the surface of the semiconductor substrate 100, and provided with the embedded metal landing pad 200 and the landing-pad passivation layer 210. Specifically, the landing-pad passivation layer 210 is located on an end surface of the embedded metal landing pad 200 close to the communication hole 111; an end surface of the embedded metal landing pad 200 apart from the communication hole 111 is connected with a barrier layer 120 in the dielectric layer 110. The dielectric layer 110 is made of at least one of silicon dioxide, silicon nitride and silicon oxynitride.

In the present embodiment, an open pore of the TSV 130 and the metal landing pad 200 are spaced apart by the dielectric layer 110 and the barrier layer 120, and not communicated with each other before a TSV packaging technology starts. Further, in another embodiment, the open pore of the TSV 130 may not be perfectly aligned with the metal landing pad 200. Even if a top end of the TSV 130 does not completely correspond to a bottom end of the metal landing pad 200 due to an error of a double etching process, a conduction function may be achieved as long as parts thereof are connected.

The communication hole 111 is formed based on the formation method of a semiconductor structure according to the above-mentioned embodiment. The dielectric layer 110 and the barrier layer 120 are etched downwards along the TSV 130 to form the communication hole 111 exposing the metal landing pad 200. Further, the dielectric layer 110 and the landing-pad passivation layer 210 are continuously etched along the TSV 130 using the corresponding etching process, so as to form the communication hole 111 exposing the metal landing pad 200. The communication hole 111 has a trapezoidal cross section. Specifically, a contact surface between the communication hole 111 and the metal landing pad 200 is defined as a first contact surface, an included angle α is formed between the first contact surface and a side wall of the communication hole 111, and $45°\leq\alpha<90°$. A size of a bottom end of an opening is reduced by reducing a vertical angle. Meanwhile, in a subsequent process, a non-vertical slope, such as a trapezoid hypotenuse, may also increase an adhesive force of the side wall to prevent delamination. Further, a contact surface between the communication hole 111 and the TSV 130 is defined as a second contact surface, and the first contact surface has an area less than the second contact surface. Since the contact area between the communication hole 111 and the metal landing pad is less than the contact area between the communication hole 111 and the TSV 130, a size of the metal landing pad 200 may be designed to be less than a size of the open pore of the TSV 130. The size of the metal landing pad 200 is less than the size of the open pore of the TSV 130 by 0.2 to 2 microns. Meanwhile, the metal landing pad 200 may be aligned or not perfectly aligned with the open pore predicted to be connected.

Passivation layers 102 are provided at a bottom and an inner wall of the communication hole 111 and an inner wall of the TSV 130, and the passivation layers of the TSV 130 and the communication hole 111 are filled with metal 300. The trapezoidal opening is filled with the filling metal 300 which covers surfaces of the passivation layer 102 and the metal landing pad 200.

Compared with a TSV packaging technology in some semiconductor technologies, in the present application, an improvement is mainly performed on designs of the TSV and the metal landing pad, and the new structural design may avoid necessary contact between the metal landing pad and the TSV, and meanwhile reduce an alignment requirement of connection with the landing pad to avoid an alignment abnormality, and reduce a size of the landing pad to increase a designable area. In addition, a technology with enhanced side wall protection is selected to improve an effect of the metal barrier layer, and a junction surface is selected to reduce a side etching phenomenon, so as to protect a material transition interface of a side wall or weakness of bonded locations between silicon wafers, thereby effectively avoiding diffusion of the metal barrier layer to improve a blocking effect thereof.

Figure 6:
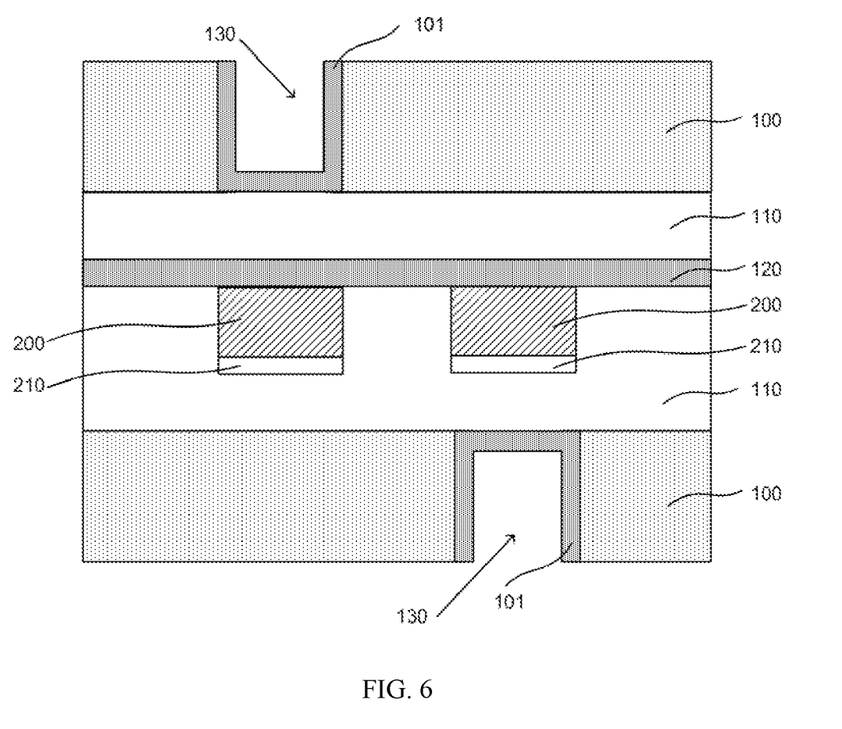
FIGS. 6 to 9 are schematic structural diagrams obtained by sequentially implementing steps in a formation method of a semiconductor structure according to another embodiment of the present application.

The present application further provides another embodiment of the formation method of a semiconductor structure, including:

Step 1: providing a plurality of semiconductor substrates 100, the semiconductor substrate 100 including a TSV 130, referring to FIG. 6. The TSV 130 is specifically formed by: etching the semiconductor substrate 100 to form an open pore; and depositing an insulating layer 101 on a surface of the open pore.

The semiconductor substrate 100 may include, but is not limited to, a monocrystalline silicon substrate, a polycrystalline silicon substrate, a gallium nitride substrate, or a sapphire substrate, and when configured as a monocrystalline substrate or a polycrystalline substrate, the semiconductor substrate 100 may also be configured as an intrinsic silicon substrate or a doped silicon substrate, and further, an N-type polycrystalline silicon substrate or a P-type polycrystalline silicon substrate.

Specifically, in the present embodiment, dry etching is performed in a direction perpendicular to a surface of the semiconductor substrate 100 to form the open pore of the substrate. Further, an insulating layer 101 is deposited on a side wall of the open pore. The insulating layer 101 is configured to isolate a metal material inside a communication hole 111 from the semiconductor substrate.

Further, a dielectric layer 110 is formed on the surface of one semiconductor substrate 100, and then, another semiconductor substrate 100 is formed on the dielectric layer 110. The dielectric layer 110 is provided with two embedded metal landing pads 200 and landing-pad passivation layers 210, and each of the two embedded metal landing pads 200 and each of the landing-pad passivation layers 210 correspond to the TSV 130 of one semiconductor substrate 100. The landing-pad passivation layer 210 is located on an end surface of the embedded metal landing pad 200 close to the TSV 130; an end surface of the embedded metal landing pad 200 apart from the TSV 130 is connected with a barrier layer 120 in the dielectric layer 110.

FIG. 6 shows a stacked wafer structure in which the TSV 130 of an upper wafer contacts the metal landing pad 200 of a lower wafer. Further, the open pore of the TSV 130 may not be perfectly aligned with the metal landing pad 200. Even if a top end of the TSV does not completely correspond to a bottom end of the metal landing pad due to an error of a double etching process, a conduction function may be achieved as long as parts thereof are connected.

Therefore, the semiconductor substrate 100 may be stacked on a surface of the dielectric layer 110, and a dielectric layer 110 may be continuously formed on the surface of the semiconductor substrate 100, so as to stack the dielectric layers 110 and the semiconductor substrates 100 layer by layer.

Figure 7:
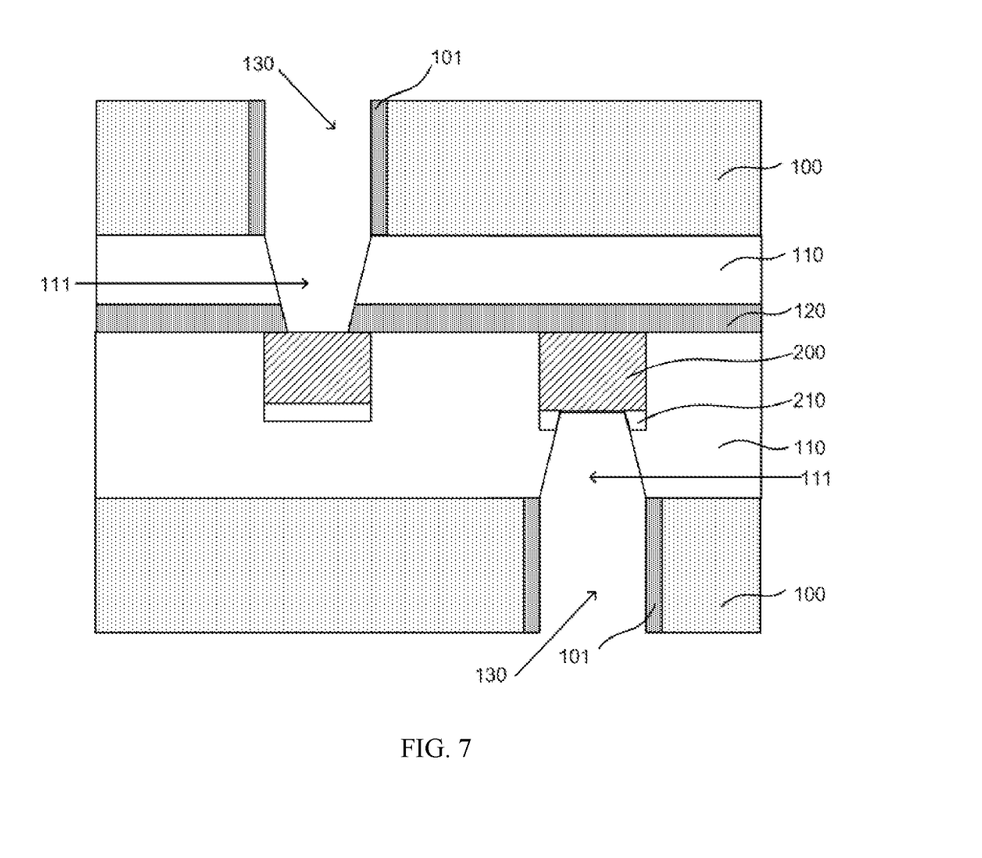

Step 2: etching the dielectric layer 110 along the TSV 130 to form the communication hole 111 exposing the metal landing pad 200, referring to FIG. 7. Therefore, the communication holes 111 in the substrates and the dielectric layers on the surfaces thereof may have same or staggered positions in a vertical direction.

Specifically, the dielectric layer 110 and the barrier layer 120 are continuously etched along the open pore of the TSV 130 to form the communication hole 111 exposing the metal landing pad 200, and as shown in FIG. 7 which is a sectional view of the semiconductor structure, the open pore of the TSV 130 has a rectangular cross section, and the communication hole 111 has a trapezoidal cross section. Further, the dielectric layer 110 and the landing-pad passivation layer 210 are continuously etched along the open pore of the TSV 130 using the corresponding etching process, so as to form the communication hole 111 exposing the metal landing pad 200.

Specifically, a contact surface between the communication hole 111 and the metal landing pad 200 is defined as a first contact surface, an included angle α is formed between the first contact surface and a side wall of the communication hole 111, and $45°\leq\alpha<90°$. A size of a bottom end of an opening is reduced by reducing a vertical angle. Meanwhile, in a subsequent process, a non-vertical slope, such as a trapezoid hypotenuse, may also increase an adhesive force of the side wall to prevent delamination.

Further, a contact surface between the communication hole 111 and the TSV 130 is defined as a second contact surface, and the first contact surface has an area less than the second contact surface. Since the contact area between the communication hole 111 and the metal landing pad 200 is less than the contact area between the communication hole 111 and the TSV 130, a size of the metal landing pad 200 may be designed to be less than a size of the open pore of the TSV 130. The size of the metal landing pad 200 is less than the size of the open pore of the TSV 130 by 0.2 to 2 microns. Meanwhile, the metal landing pad 200 may be aligned or not perfectly aligned with the open pore predicted to be connected.

Figure 8:
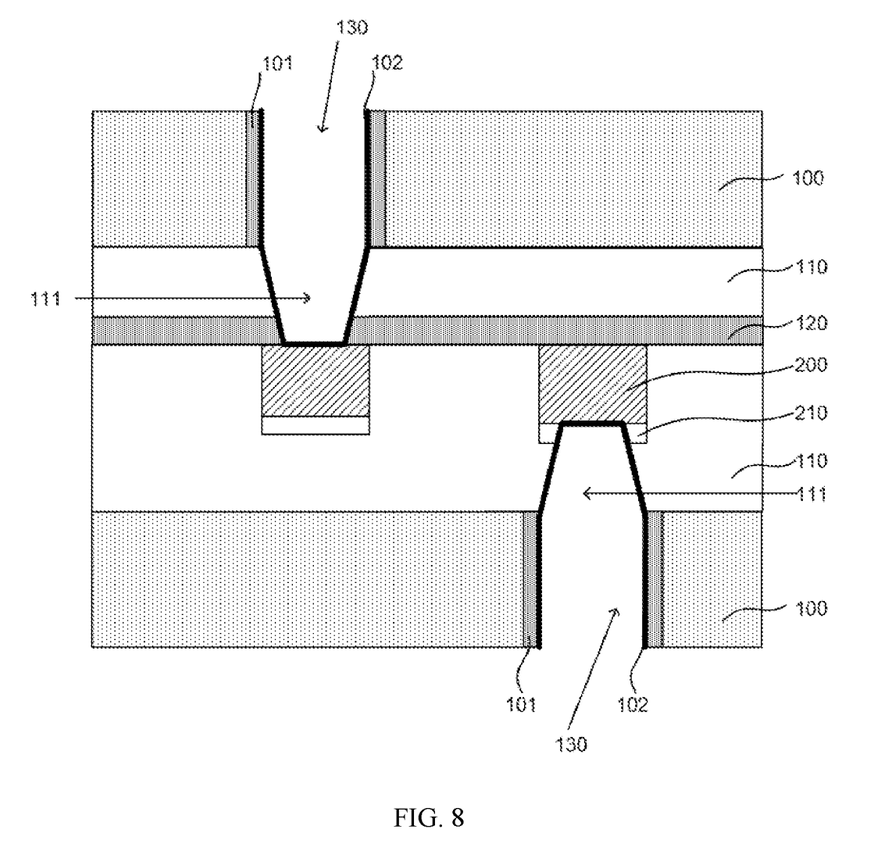

Step 3: forming passivation layers 102 on inner walls and bottoms of the TSV 130 and the communication hole 111, referring to FIG. 8.

Specifically, the passivation layers 102 are deposited on surfaces of the inner walls of the TSV 130 and the communication hole 111. In the present embodiment, an electroplating method may be used for the deposition. The passivation layer 102 is made of tantalum, tantalum nitride, and copper seeds.

The passivation layer 102 is configured to prevent a filled conductive material from migrating towards the substrate and also to improve adhesion between the conductive material and the insulating layer to enhance an adhesive force. For example, the passivation layer 102 is made of copper seeds. In order to better facilitate the subsequent process of filling a metal layer, preparation may be made in advance to form a copper seed layer in this step.

If applied to a final TSV structure after silicon wafers are stacked (that is, a semiconductor process is completed first, and then, a TSV process is performed), the TSV etching operation with weak side wall protection may generate a significant side etching phenomenon on a weak junction surface of bonded locations between the silicon wafers, which not only does not facilitate generation of a metal barrier layer, but also becomes weakness of future chip delamination. Therefore, the passivation layers 102 are required to be formed on the surfaces of the TSV and the communication hole 111, and the diffusion of the metal barrier layer is effectively avoided to improve the blocking effect thereof.

Figure 9:
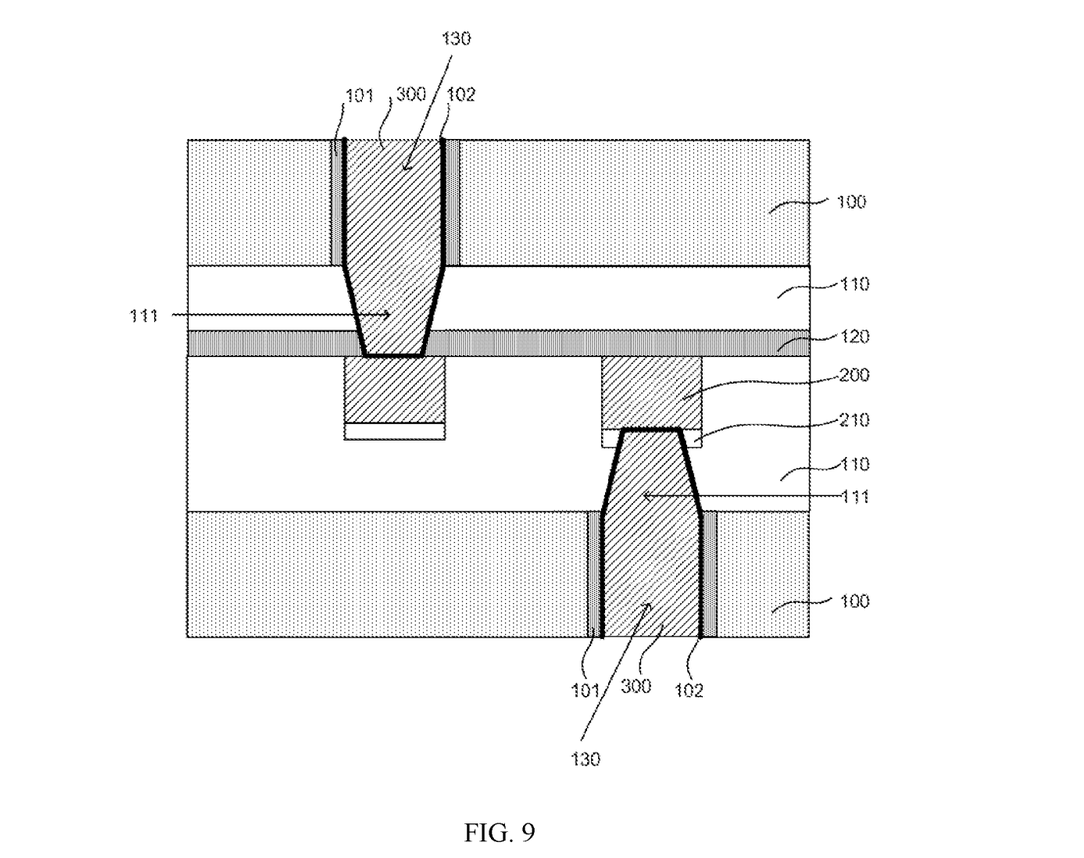

Step 4: filling the TSV 130 and the communication hole 111 with metal 300 to cover the passivation layer 102 and the metal landing pad 200, referring to FIG. 9. Copper may serve as the filling metal 300.

Therefore, in the present application, the improvement is mainly performed on the designs of the TSV and the metal landing pad, and the new structural design may avoid necessary contact between the metal landing pad and the TSV, and meanwhile reduce the alignment requirement of connection with the landing pad to avoid the alignment abnormality, and reduce the size of the landing pad to increase the designable area. In addition, the technology with enhanced side wall protection is selected to improve the effect of the metal barrier layer, and a junction surface is selected to reduce a side etching phenomenon, so as to protect a material transition interface of a side wall or weakness of bonded locations between silicon wafers, thereby effectively avoiding diffusion of the metal barrier layer to improve a blocking effect thereof.

The present application further provides a semiconductor structure.

Referring to FIG. 7, the semiconductor structure includes a semiconductor substrate 100, a metal landing pad 200, a landing-pad passivation layer 210, an insulating layer 101 and a dielectric layer 110.

The semiconductor substrate 100 is provided with a TSV 130. The semiconductor substrate 100 may include, but is not limited to, a monocrystalline silicon substrate, a polycrystalline silicon substrate, a gallium nitride substrate, or a sapphire substrate, and when configured as a monocrystalline substrate or a polycrystalline substrate, the semiconductor substrate 100 may also be configured as an intrinsic silicon substrate or a doped silicon substrate, and further, an N-type polycrystalline silicon substrate or a P-type polycrystalline silicon substrate. In the present embodiment, dry etching is performed in a direction perpendicular to a surface of the semiconductor substrate 100 to form an open pore of the substrate. The insulating layer 101 is configured to isolate a metal material inside a communication hole 111 from the semiconductor substrate.

The dielectric layer 110 is deposited on the surface of the semiconductor substrate 100, and provided with the embedded metal landing pad 200 and the landing-pad passivation layer 210. Specifically, the landing-pad passivation layer 210 is located on an end surface of the embedded metal landing pad 200 close to the communication hole 111; an end surface of the embedded metal landing pad 200 apart from the communication hole 111 is connected with a barrier layer 120 in the dielectric layer 110. The dielectric layer is made of at least one of silicon dioxide, silicon nitride and silicon oxynitride.

In the present embodiment, the open pore of the TSV 130 and the metal landing pad 200 are spaced apart by the dielectric layer 110 and the barrier layer 120, and not communicated with each other before a TSV packaging technology starts. Further, the present embodiment is suitable for not only a single wafer with the TSV formed from B/S, but also stacked wafers. FIG. 6 shows a stacked wafer structure in which the TSV of an upper wafer contacts the metal landing pad of a lower wafer. Further, the open pore of the TSV 130 may not be perfectly aligned with the metal landing pad 200. Even if a top end of the TSV does not completely correspond to a bottom end of the metal landing pad due to an error of a double etching process, a conduction function may be achieved as long as parts thereof are connected. Therefore, in the present embodiment, a corresponding structure may also exist: the semiconductor substrate is stacked on the surface of the dielectric layer.

The communication hole 111 is formed based on the formation method of a semiconductor structure according to the above-mentioned embodiment. The dielectric layer 110 and the barrier layer 120 are etched downwards along the rectangular open pore of the TSV 130 to form the communication hole 111 exposing the metal landing pad 200. Further, the dielectric layer 110 and the landing-pad passivation layer 210 are continuously etched along the open pore of the TSV 130 using the corresponding etching process, so as to form the communication hole 111 exposing the metal landing pad 200. The communication hole 111 has a trapezoidal cross section. Specifically, a contact surface between the communication hole 111 and the metal landing pad 200 is defined as a first contact surface, an included angle α is formed between the first contact surface and a side wall of the communication hole 111, and 45°≤α<90°. A size of a bottom end of an opening is reduced by reducing a vertical angle. Meanwhile, in a subsequent process, a non-vertical slope, such as a trapezoid hypotenuse, may also increase an adhesive force of the side wall to prevent delamination. Further, a contact surface between the communication hole 111 and the TSV 130 is defined as a second contact surface, and the first contact surface has an area less than the second contact surface. Since the contact area between the communication hole 111 and the metal landing pad is less than the contact area between the communication hole 111 and the TSV 130, a size of the metal landing pad 200 may be designed to be less than a size of the open pore of the TSV 130. The size of the metal landing pad 200 is less than the size of the open pore of the TSV 130 by 0.2 to 2 microns. Meanwhile, the metal landing pad 200 may be aligned or not perfectly aligned with the open pore predicted to be connected.

Passivation layers 102 are provided at a bottom and an inner wall of the communication hole 111 and an inner wall of the TSV 130, and the passivation layers of the TSV 130 and the communication hole 111 are filled with the metal 300. The trapezoidal opening is filled with the filling metal 300 which covers the surfaces of the passivation layer 102 and the metal landing pad 200.

Compared with a TSV packaging technology in some semiconductor technologies, in the present application, an improvement is mainly performed on designs of the TSV and the metal landing pad, and the new structural design may avoid necessary contact between the metal landing pad and the TSV, and meanwhile reduce an alignment requirement of connection with the landing pad to avoid an alignment abnormality, and reduce a size of the landing pad to increase a designable area. In addition, the technology with enhanced side wall protection is selected to improve the effect of the metal barrier layer, and a junction surface is selected to reduce a side etching phenomenon, so as to protect a material transition interface of a side wall or weakness of bonded locations between silicon wafers, thereby effectively avoiding diffusion of the metal barrier layer to improve a blocking effect thereof.

The above is only preferred embodiments of the application. It shall be pointed out that those skilled in the art may also make some improvements and modifications without departing from the principle of the application. These improvements and modifications shall fall within the protective scope of the application.

What is claimed is:

1. A formation method of a semiconductor structure, comprising:
   providing a semiconductor substrate, the semiconductor substrate comprising a through silicon via (TSV);
   forming a dielectric layer on a surface of the semiconductor substrate, the dielectric layer being provided with two embedded metal landing pads; and
   stacking an additional semiconductor substrate on the dielectric layer, the additional semiconductor substrate comprising an additional TSV; and
   etching the dielectric layer along the TSV to form a communication hole for communicating the TSV with one of the two metal landing pads, and etching the dielectric layer along the additional TSV to form an additional communication hole for communicating the additional TSV with the other of the two metal landing pads,
   wherein a size of the one metal landing pad being communicated with the TSV is less than a size of an open pore of the TSV.

2. The formation method if a semiconductor structure according to claim 1, further comprising the following steps:
   forming passivation layers at a bottom and an inner wall of the communication hole and an inner wall of the TSV;
   filling the communication hole and the TSV with metal.

3. The formation method of a semiconductor structure according to claim 1, wherein a contact surface between the communication hole and the metal landing pad serves as a first contact surface, an included angle α is formed between the first contact surface and a side wall of the communication hole, and 45°≤α<90°.

4. The formation method of a semiconductor structure according to claim 3, wherein a contact surface between the communication hole and the TSV serves as a second contact surface, and the first contact surface has an area less than the second contact surface.

5. A semiconductor structure made by the forming method of claim 1, comprising:
   a semiconductor substrate comprising a through silicon via (TSV);

a dielectric layer on a surface of the semiconductor substrate, the dielectric layer being provided with two embedded metal landing pads;

an additional semiconductor substrate on the dielectric layer, the additional semiconductor substrate comprising an additional TSV;

a communication hole provided in the dielectric layer, one of the two metal landing pads being communicated with the TSV through the communication hole; and an additional communication hole provided in the dielectric layer, the other of the two metal landing pads being communicated with the additional TSV through the additional communication hole, wherein a size of the metal landing pad being communicated with the TSV is less than a size of an open pore of the TSV.

6. The semiconductor structure according to claim 5, wherein a contact surface between the communication hole and the metal landing pad serves as a first contact surface, an included angle α is formed between the first contact surface and a side wall of the communication hole, and $45° \leq \alpha < 90°$.

7. The semiconductor structure according to claim 6, wherein a contact surface between the communication hole and the TSV serves as a second contact surface, and the first contact surface has an area less than the second contact surface.

8. The semiconductor structure according to claim 5, wherein passivation layers are provided at a bottom and an inner wall of the communication hole and an inner wall of the TSV, and the passivation layers of the TSV and the communication hole are filled with metal.

* * * * *